United States Patent
Osada et al.

(10) Patent No.: US 9,633,921 B2
(45) Date of Patent: Apr. 25, 2017

(54) SEMICONDUCTOR ENCAPSULATION RESIN COMPOSITION AND SEMICONDUCTOR DEVICE COMPRISED OF CURED PRODUCT OF THE SEMICONDUCTOR ENCAPSULATION RESIN COMPOSITION

(71) Applicant: Shin-Etsu Chemical Co., Ltd., Tokyo (JP)

(72) Inventors: Shoichi Osada, Annaka (JP); Naoyuki Kushihara, Annaka (JP); Ryuhei Yokota, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/133,547

(22) Filed: Apr. 20, 2016

(65) Prior Publication Data
US 2016/0336246 A1 Nov. 17, 2016

(30) Foreign Application Priority Data

May 11, 2015 (JP) .................................. 2015-096447

(51) Int. Cl.
| | | |
|---|---|---|
| H01L 23/29 | (2006.01) | |
| C09D 179/00 | (2006.01) | |
| H01L 23/31 | (2006.01) | |
| H01L 23/495 | (2006.01) | |
| C09D 161/06 | (2006.01) | |
| C09D 179/04 | (2006.01) | |
| C08L 61/06 | (2006.01) | |
| C08L 79/04 | (2006.01) | |
| H01L 29/20 | (2006.01) | |
| H01L 29/16 | (2006.01) | |
| C08G 8/04 | (2006.01) | |
| C08G 73/06 | (2006.01) | |
| C08G 77/50 | (2006.01) | |

(52) U.S. Cl.
CPC ............ *H01L 23/293* (2013.01); *C08L 61/06* (2013.01); *C08L 79/04* (2013.01); *C09D 161/06* (2013.01); *C09D 179/00* (2013.01); *C09D 179/04* (2013.01); *H01L 23/296* (2013.01); *H01L 23/3107* (2013.01); *H01L 23/49582* (2013.01); *C08G 8/04* (2013.01); *C08G 73/0655* (2013.01); *C08G 77/50* (2013.01); *H01L 29/1608* (2013.01); *H01L 29/2003* (2013.01)

(58) Field of Classification Search
None
See application file for complete search history.

(56) References Cited

U.S. PATENT DOCUMENTS

| 4,785,075 A | 11/1988 | Shimp | |
|---|---|---|---|
| 5,298,548 A | 3/1994 | Shiobara et al. | |
| 9,382,459 B2* | 7/2016 | Ogawa .................. | C08G 59/28 |
| 2004/0254329 A1 | 12/2004 | Daum et al. | |
| 2012/0111621 A1* | 5/2012 | Ohigashi ................. | B32B 15/08 |
| | | | 174/258 |
| 2012/0123082 A1* | 5/2012 | Ogawa .................. | C08G 59/184 |
| | | | 528/93 |
| 2013/0245161 A1* | 9/2013 | Hsieh ...................... | C08L 79/04 |
| | | | 523/466 |
| 2015/0307708 A1* | 10/2015 | Chiba .................... | C08G 59/24 |
| | | | 428/195.1 |
| 2015/0353731 A1* | 12/2015 | Kushihara ................ | C08G 8/22 |
| | | | 528/210 |

FOREIGN PATENT DOCUMENTS

| JP | 64-43527 A | | 2/1989 |
|---|---|---|---|
| JP | 6-15603 B2 | | 3/1994 |
| JP | 11-106480 A | | 4/1999 |
| JP | 2001-172473 A | | 6/2001 |
| JP | 2001-206931 A | | 7/2001 |
| JP | 2001-210759 | * | 8/2001 |
| JP | 2005-506422 A | | 3/2005 |
| JP | 2013-53218 A | | 3/2013 |
| JP | 2015-044963 | * | 3/2015 |
| JP | 2015-048422 | * | 3/2015 |
| JP | 2015-157467 | * | 9/2015 |

OTHER PUBLICATIONS

Engineering Materials, vol. 59, No. 11, Nov. 2011, pp. 58-63.
Extended European Search report dated Oct. 4, 2016, for European Application No. 16164236.8.

* cited by examiner

*Primary Examiner* — Marc Zimmer
(74) *Attorney, Agent, or Firm* — Birch, Stewart, Kolasch & Birch, LLP

(57) ABSTRACT

Provided is a semiconductor encapsulation resin composition exhibiting an insignificant heat decomposition when left under a high temperature of 200 to 250° C. for a long period of time; and a superior reliability and adhesion to a Cu LF and Ag plating under a high-temperature and high-humidity environment. The composition comprises:
(A) a cyanate ester compound having not less than two cyanato groups in one molecule;
(B) a phenolic compound;
(C) at least one epoxy resin;
(D) a copolymer obtained by a hydrosilylation reaction of an alkenyl group-containing epoxy compound and an organopolysiloxane; and
(E) at least one compound selected from a tetraphenylborate salt of a tetra-substituted phosphonium compound and a tetraphenylborate salt.
A molar ratio of phenolic hydroxyl groups in (B) to cyanato groups in (A) is 0.08 to 0.25, and a molar ratio of epoxy groups in (C) and (D) to cyanato groups in (A) is 0.04 to 0.25.

6 Claims, No Drawings

SEMICONDUCTOR ENCAPSULATION RESIN COMPOSITION AND SEMICONDUCTOR DEVICE COMPRISED OF CURED PRODUCT OF THE SEMICONDUCTOR ENCAPSULATION RESIN COMPOSITION

BACKGROUND OF THE INVENTION

Field of the Invention

The present invention relates to a semiconductor encapsulation resin composition; and a semiconductor device comprising a cured product of such composition.

Background Art

In recent years, as a countermeasure(s) against global warming, there have been promoted global-scale environmental actions such as energy source conversions from fossil fuels. For this reason, in the automotive field, the number of hybrid vehicles and electric vehicles manufactured has increased. Further, in emerging countries such as China and India, there have been seen more types of home electronics equipped with an inverter motor as an energy saving measure.

In the case of hybrid and/or electric vehicles and invertor motors, a power semiconductor is critical for converting alternate current to direct current or vice versa, and for performing voltage transformation. However, silicon (Si) which has been used as a semiconductor for many years is approaching its performance limitation. For example, it has become difficult to expect a drastic performance improvement as is the case where lowering of the resistance of a power MOSFET is attempted to reduce power loss at the time of power conversion. Here, much attention has been drawn to next-generation power semiconductors employing wide band-gap semiconductors such as silicon carbide (SiC), gallium nitride (GaN) and diamond. Particularly, developments are being made in the production of a low-loss power MOSFET using SiC.

As wide band-gap semiconductors, SiC and GaN have a superior property that their band gaps are about 3 times wider than that of Si, and their breakdown field strengths are 10 or more times higher than that of Si. Also, these wide band-gap semiconductors have features such as a high-temperature operation (reportedly operable at 650° C. in the case of SiC), a high thermal conductivity (same level as Cu in the case of SiC) and a high saturated electron drift velocity. Due to these features, the on resistance of a power semiconductor can be lowered by employing SiC and GaN, such that the power loss in a power converter circuit can be drastically reduced.

A power semiconductor is usually protected through transfer molding using an epoxy resin and/or through potting encapsulation using a silicone gel. In these days, from the perspective of reduction in size and weight, transfer molding using an epoxy resin has almost become a mainstream encapsulation method. However, although an epoxy resin is a well-balanced heat curable resin superior in adhesion to a base material and in-mechanical strength, a heat decomposition at crosslinked points will progress at a temperature higher than 200° C. For this reason, there has been a concern that an epoxy resin may not be able to serve as an encapsulation material under such a high-temperature operation environment as it is expected of SiC and GaN (see ENGINEERING MATERIALS November issue of 2011 (vol. 59 No. 11) p. 58 to 63).

Here, as a material superior in heat resistance, there has been considered a heat curable resin composition containing a cyanate resin(s). For example, Japanese Examined Patent Publication No. H6-15603 discloses that a stable heat resistance can be achieved by allowing an oxazole ring(s) to be formed in a cured product of a phenol novolac resin. Such oxazole ring(s) are formed by a reaction of a multivalent cyanate ester and an epoxy resin. Further, Japanese Examined Patent Publication No. H6-15603 discloses that a cured product superior in heat and water resistances can be obtained when the hydroxyl equivalent of a phenol novolac resin is 0.4 to 1.0, and the cyanato group equivalent of a multivalent cyanate ester is 0.1 to 0.6, with respect to 1 epoxy equivalent of an epoxy resin. Furthermore, JP-A-2013-53218 describes that a heat curable resin composition having a particular structure and containing a cyanate ester compound, a phenolic compound and an inorganic filler, and that the heat curable resin composition is superior in heat resistance and has a high mechanical strength.

SUMMARY OF THE INVENTION

However, the composition disclosed in Japanese Examined Patent Publication No. H6-15603 requires a high-temperature and prolonged heat curing step for forming an oxazole ring(s) by a reaction of epoxy groups and cyanato groups. That is, the composition disclosed in Japanese Examined Patent Publication No. H6-15603 has a problem of being inferior in mass productivity. Further, the composition disclosed in JP-A-2013-53218 has an insufficient moisture resistance. Therefore, this composition has a problem that an adhesion of Cu LF (cupper lead frame) and/or Ag plating to the cured product will be impaired when left under a high-temperature and high-humidity environment for a long period of time, and peeling and/or cracks will then occur in such case. In view of the abovementioned problems, it is an object of the present invention to provide a resin composition exhibiting a smaller degree of heat decomposition (reduction in weight) when left for a long period of time under a high-temperature environment of not lower than 200° C., e.g. 200 to 250° C.; and a superior reliability and a superior adhesion to a Cu LF and an Ag plating even under a high-temperature and high-humidity environment.

The inventors of the present invention diligently conducted a series of studies to solve the above problems, and arrived at the following findings. That is, a cured product having a superior thermal stability can be obtained by combining a cyanate ester compound, a phenolic compound having a particular structure, an epoxy resin and a curing accelerator; and by employing a particular range of the quantity of the phenolic compound to the cyanate ester compound and a particular range of the quantity of the epoxy resin to the cyanate ester compound. Such cured product exhibits a smaller degree of heat decomposition (reduction in weight) and is able to maintain a superior adhesion to a Cu LF and/or an Ag plating, even when exposed to a high-temperature and high-humidity environment for a long period of time. The present invention was thus made based on these findings.

That is, the present invention is a semiconductor encapsulation resin composition including:
  (A) a cyanate ester compound having not less than two cyanato groups in one molecule;
  (B) a phenolic compound represented by the following general formula (3)

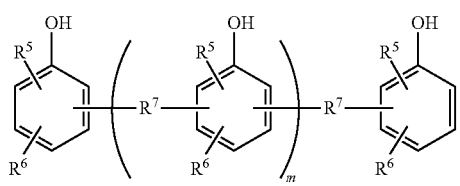
(3)

wherein in formula (3), m represents an integer of 0 to 10; each of the multiple $R^5$s independently represents a hydrogen atom or an alkyl group having 1 to 4 carbon atoms; each of the multiple $R^6$s independently represents a hydrogen atom or an alkyl group having 1 to 4 carbon atoms; and each $R^7$ independently represents a group selected from the divalent groups expressed by the following formulae

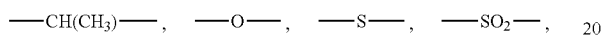

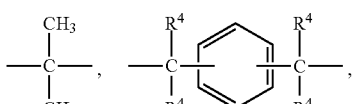

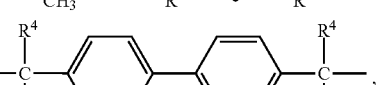

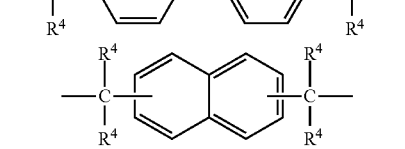

wherein in the above formulae, each $R^4$ independently represents a hydrogen atom or a methyl group;

(C) at least one of the epoxy resins represented by the following formulae (5) and (6)

(5)

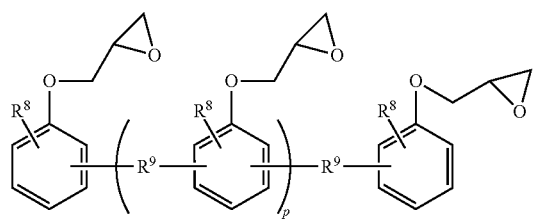

(6)

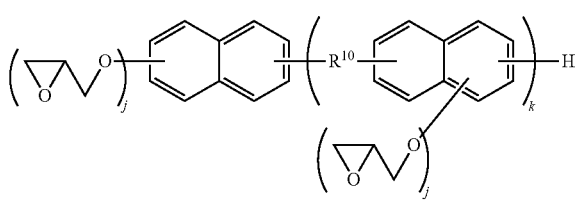

wherein in formula (5), $R^8$ independently represents a hydrogen atom or an alkyl group having 1 to 4 carbon atoms; $R^9$ independently represents a group selected from the divalent groups expressed by the following formulae; and p represents an integer of 0 to 10, and wherein in formula (6), $R^{10}$ independently represents a group selected from the divalent groups expressed by the following formulae; j independently represents an integer of 1 to 6; and k represents an integer of 0 to 10

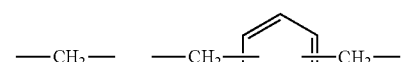

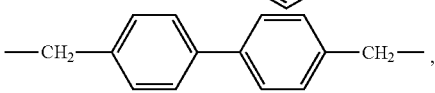

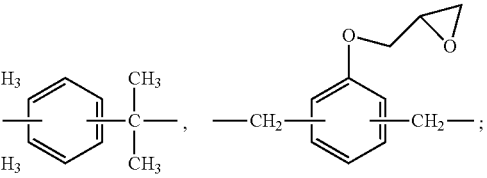

(D) a copolymer obtained by a hydrosilylation reaction of an alkenyl group-containing epoxy compound and an organopolysiloxane represented by the following average formula (8)

$$H_a R_b^{11} SiO_{\frac{4-(a+b)}{2}} \quad (8)$$

wherein in formula (8), $R^{11}$ independently represents a substituted or unsubstituted monovalent hydrocarbon group having 1 to 10 carbon atoms; a is a positive number satisfying $0.01 \leq a \leq 1$, and b is a positive number satisfying $1 \leq b \leq 3$, provided that $1.01 \leq a+b < 4$; and (E) at least one kind of a compound selected from a tetraphenylborate salt of a tetra-substituted phosphonium compound and a tetraphenylborate salt represented by the following formula (9)

(9)

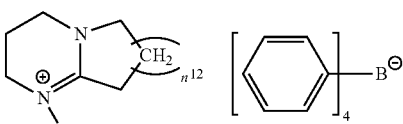

wherein in formula (9), $R^{15}$ represents a hydrogen atom, an alkyl group having 1 to 6 carbon atoms or a phenyl group; and $n^{12}$ represents an integer of 1 to 3, and wherein a molar ratio of phenolic hydroxyl groups in said phenolic compound (B) to cyanato groups in said cyanate ester compound (A) is 0.08 to 0.25, and a molar ratio of epoxy groups in said epoxy resin (C) and said component (D) to cyanato groups in said cyanate ester compound (A) is 0.04 to 0.25.

The composition of the present invention is able to provide a cured product exhibiting a smaller degree of heat decomposition (reduction in weight) even when left under a high-temperature environment of not lower than 200° C., particularly 200 to 250° C. for a long period of time; a superior adhesion to a Cu LF and an Ag plating even under a high-temperature and high-humidity environment; and a high insulation property. In this way, a semiconductor device encapsulated by the cured product of the composition of the present invention has a long-term reliability under a high-temperature and high-humidity environment.

DETAILED DESCRIPTION OF THE INVENTION

The present invention is described in greater detail hereunder.

(A) Cyanate Ester Compound

A component (A) is a cyanate ester compound having not less than two cyanate groups in one molecule. As the cyanate ester compound of the present invention, there may be used a generally known cyanate ester compound so long as the compound has not less than two cyanate groups in one molecule. One example of such cyanate ester compound is that represented by the following general formula (1):

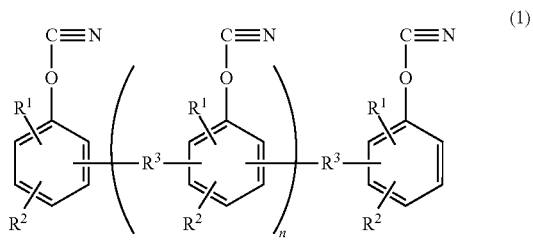

wherein in formula (1), each of the multiple $R^1$s independently represents a hydrogen atom or an alkyl group having 1 to 4 carbon atoms; each of the multiple $R^2$s independently represents a hydrogen atom or an alkyl group having 1 to 4 carbon atoms; each $R^3$ independently represents a group selected from the divalent groups expressed by the following formulae:

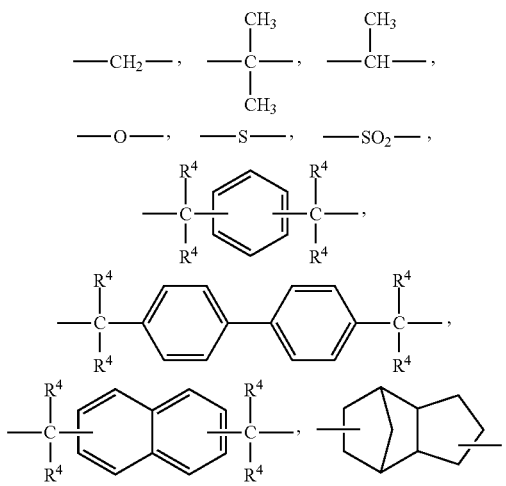

(in the above formulae, each $R^4$ independently represents a hydrogen atom or a methyl group); and n is an integer of 0 to 10)

Examples of the cyanate ester compound as the component (A) include bis (4-cyanatophenyl) methane, bis (3-methyl-4-cyanatophenyl) methane, bis (3-ethyl-4-cyanatophenyl) methane, bis (3,5-dimethyl-4-cyanatophenyl) methane, 1,1-bis (4-cyanatophenyl) ethane, 2,2-bis (4-cyanatophenyl) propane, 2,2-bis (4-cyanatophenyl)-1,1,1,3,3,3-hexafluoropropane, di (4-cyanatophenyl) thioether, 1,3-dicyanatobenzene, 1,4-dicyanatobenzene, 2-tert-butyl-1,4-dicyanatobenzene, 2,4-dimethyl-1,3-dicyanatobenzene, 2,5-di-tert-butyl-1,4-dicyanatobenzene, tetramethyl-1,4-dicyanatobenzene, 1,3,5-tricyanatobenzene, 2,2'-dicyanatobiphenyl, 4,4'-dicyanatobiphenyl, 3,3',5,5'-tetramethyl-4,4'-dicyanatobiphenyl, 1,3-dicyanatonaphthalene, 1,4-dicyanatonaphthalene, 1,5-dicyanatonaphthalene, 1,6-dicyanatonaphthalene, 1,8-dicyanatonaphthalene, 2,6-dicyanatonaphthalene, 2,7-dicyanatonaphthalene, 1,3,6-tricyanatonaphthalene; 1,1,1-tris (4-cyanatophenyl) ethane, bis (4-cyanatophenyl) ether; 4,4'-(1,3-phenylenediisopropylidene) diphenyl cyanate, bis (4-cyanatophenyl) thioether, bis (4-cyanatophenyl) sulfone, tris (4-cyanato-phenyl) phosphine, tris (4-cyanatophenyl) phosphate, phenol novolac-type cyanate, cresol novolac-type cyanate, dicyclopentadiene novolac-type cyanate, phenyl aralkyl-type cyanate ester, biphenyl aralkyl-type cyanate ester and naphthalene aralkyl-type cyanate ester. Any one of the above cyanate ester compounds may be used singularly, or two or more of them may be used in combination.

The abovementioned cyanate ester compound is obtained by a reaction of phenols and a cyanogen chloride under a basic condition. According to the intended use, the above cyanate ester compound can be appropriately selected from those exhibiting a wide variety of structural properties such as those being a solid and having a softening point of 106° C. and those being a liquid at a normal temperature. For example, it is preferred that a cyanate ester compound in the form of a liquid at a normal temperature be used when producing a liquid epoxy resin composition, and that the cyanate ester compound be selected in accordance with a solubility and a solution viscosity if a varnish is to be prepared by dissolving such cyanate ester compound in a solvent. Further, it is preferred that a cyanate ester compound in the form of a solid at a normal temperature be selected if the cyanate ester compound is to be used to perform transfer molding for power semiconductor encapsulation.

Moreover, a cyanate ester compound with a small cyanato group equivalent i.e. a cyanate ester compound having a small molecular weight(s) between functional groups leads to a small cure shrinkage such that a cured product exhibiting a low thermal expansion and a high glass-transition temperature can be obtained. Although a cyanate ester compound with a large cyanato group equivalent exhibits a slightly reduced glass-transition temperature, a triazine crosslinking distance(s) thereof is flexible such that there can be expected a low elasticity, high toughness and a low water absorbability. It is preferable when the chlorine bonded or remaining in the cyanate ester compound be in an amount of not larger than 50 ppm, more preferably not larger than 20 ppm. When the amount of such chlorine is larger than 50 ppm and the cured product has been exposed to a high-temperature environment for a long period of time, chlorine or chlorine ions freed due to a heat decomposition will corrode an oxidized Cu frame, Cu wire and/or Ag plating in a manner such that the cured product may be peeled off and electrical failures may occur. Further, the insulation property of a resin may also be impaired. The cyanate ester compound as the component (A) is added in an amount of 40 to 80 parts by mass, preferably 50 to 76 parts by mass with respect to 100 parts by mass of a whole resin composition.

(B) Phenolic Compound

A phenolic compound (B) of the present invention is represented by the following general formula (3) and has not less than two hydroxyl groups in one molecule.

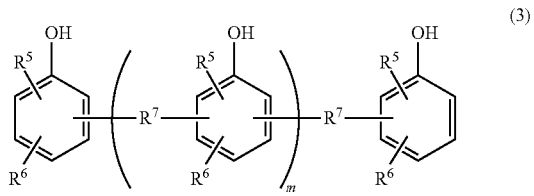

(3)

In formula (3), each of the multiple $R^5$s independently represents a hydrogen atom or an alkyl group having 1 to 4 carbon atoms; each of the multiple $R^6$s independently represents a hydrogen atom or an alkyl group having 1 to 4 carbon atoms; and m represents an integer of 0 to 10.

In formula (3), each $R^7$ independently represents a group selected from the divalent groups expressed by the following formulae.

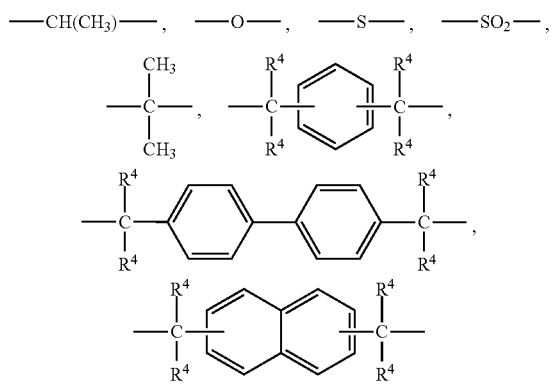

(In the above formulae, each $R^4$ independently represents a hydrogen atom or a methyl group)

The component (B) of the present invention does not include a type of phenolic compound represented by the formula (3) where $R^7$ is $CH_2$ (e.g. phenol novolac resin). A composition containing a phenolic compound whose $R^7$ is $CH_2$ is susceptible to heat decomposition when exposed to a high-temperature environment for a long period of time. Further, peeling and cracks may also occur in the interface between a copper lead frame and a cured product made of such composition, as a result of being exposed to a high-temperature environment for a long period of time.

Conventionally, metal salts, metal complexes and the like have been used as curing catalysts for cyanate ester compounds (e.g. JP-A-Sho 64-43527, JP-A-Hei 11-106480 and Japanese Unexamined Patent Application Publication (Translation of PCT Application) No. 2005-506422). However, these metal salts and metal complexes used as curing catalysts are transition metals, and there has been a concern that transition metals may promote the oxidation degradation of an organic resin under a high temperature. As for the composition of the present invention, the aforementioned phenolic compound serves as a catalyst for the cyclization reaction of a cyanate ester compound. Accordingly, in the present invention, there is no need to use metal salts and metal complexes as curing catalysts of a cyanate ester compound. That is, the present invention is capable of further improving a long-term storage stability under a high temperature.

In addition, a phenolic compound having at least two or more hydroxyl groups in one molecule, serves as a cross-linking agent linking triazine rings together. Unlike epoxy resins and amine compounds, a phenolic compound is capable of forming structure expressed by —C—O—Ar— when bonded to a cyanate ester compound. Since this structure is analogous to a triazine ring structure formed when a cyanate ester compound alone has been cured, a heat resistance of the cured product obtained can be further improved.

Here, a phenolic compound with a small hydroxyl group equivalent e.g. a phenolic compound with a hydroxyl group equivalent of not larger than 110 is highly reactive with cyanato groups. For this reason, when melting and kneading a composition at a temperature of not higher than 120° C., a curing reaction progresses in a way such that a fluidity may be significantly impaired. Therefore, a phenolic compound with a small hydroxyl group equivalent is not preferable for performing transfer molding. Thus, a phenolic compound with a hydroxyl group equivalent of greater than 110 is particularly preferred.

In the present invention, it is preferred that the phenolic compound be added in an amount at which phenolic hydroxyl groups are present in an amount of 0.08 to 0.25 mol, preferably 0.08 to 0.23 mol, more preferably 0.12 to 0.20 mol with respect to 1 mol of the cyanato groups in the cyanate ester compound. When the amount of the phenolic compound is below the abovementioned lower limit value, the cyanato groups will be reacted inadequately in a way such that the unreacted cyanato groups will remain. The remaining cyanato groups are subjected to hydrolysis under a high-humidity atmosphere. That is, a cured product will then exhibit a decrease in mechanical strength and a decrease in adhesive force to a base material. Further, when the amount of the phenolic compound is greater than the abovementioned upper limit value, the curing reaction will progress even from a low-temperature state. In such case, the fluidly of the composition will be impaired in a way such that a moldability will be impaired as well. Moreover, it is desired that the halogen elements, alkali metals or the like in the above phenolic compound be present in an amount of 10 ppm, particularly not larger than 5 ppm by extraction under 2 atm at 120° C.

(C) Epoxy Resin

A component (C) is at least one of the epoxy resins represented by the following formulae (5) and (6).

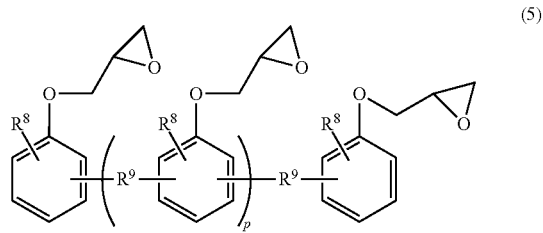

(5)

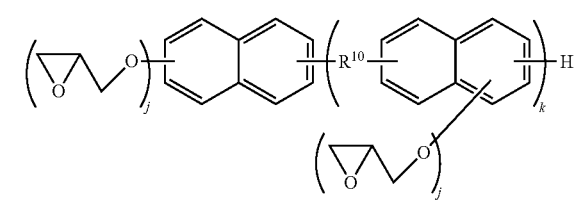

(6)

In the above formula (5), $R^8$ independently represents a hydrogen atom or an alkyl group having 1 to 4 carbon atoms;

$R^9$ independently represents a group selected from the divalent groups expressed by the following formulae; and p represents an integer of 0 to 10. In the above formula (6), $R^{10}$ independently represents a group selected from the divalent groups expressed by the following formulae; j independently represents an integer of 1 to 6; and k represents an integer of 0 to 10.

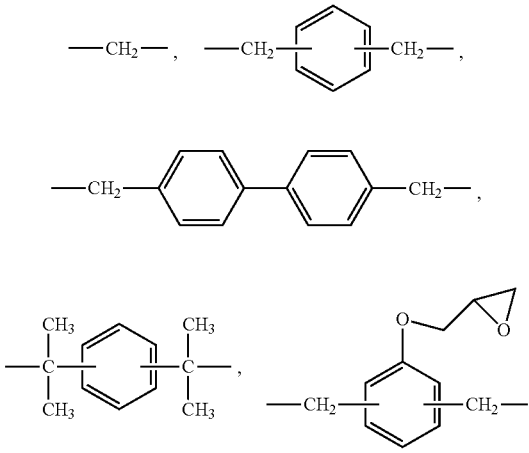

Examples of the above epoxy resin include a phenol aralkyl-type epoxy resin, a biphenyl aralkyl-type epoxy resin and a naphthalene-type aralkyl epoxy resin. Although an epoxy resin forms an oxazole ring(s) with a cyanate resin, a slower reactivity is confirmed as compared to the formation of triazine ring(s) of cyanato groups. Here, a higher percentage of epoxy groups leads to a longer curing time, which is unfavorable for performing transfer molding. While there also exists an example where a tertiary amine such triethyl amine is used, a storage stability may be impaired in such case.

In the present invention, an epoxy resin compound is added in an amount where the epoxy group equivalent of both the epoxy resin (C) and a later-described compound (D) will be in an amount of 0.04 to 0.25 mol, preferably 0.06 to 0.23 mol, more preferably 0.12 to 0.20 mol with respect to 1 mol of the cyanato groups in the cyanate ester compound. When the amount of the epoxy resin is below the abovementioned lower limit value, a moisture content of the cured product will become large in a way such that peeling will occur between a lead frame and the cured product under a high-temperature and high-humidity environment. Further, when the amount of the epoxy resin is greater than the abovementioned upper limit value, curing will be insufficient in a way such that the glass-transition temperature of the cured product may decrease, and that a storage property under a high-temperature and high-humidity environment may be impaired.

A component (D) is a copolymer compound obtained by a hydrosilylation reaction of an alkenyl group-containing epoxy compound and a hydrogen organopolysiloxane represented by the following average formula (8). By allowing the composition of the present invention to contain such copolymer, there can be ensured a high temperature resistance and a low moisture absorbency.

 (8)

(In formula (8), $R^{11}$ represents a substituted or unsubstituted monovalent hydrocarbon group having 1 to 10 carbon atoms, preferably 1 to 6 carbon atoms; a satisfies $0.01 \leq a \leq 1$, and b satisfies $1 \leq b \leq 3$, provided that $1.01 \leq a+b < 4$)

An alkenyl group-containing epoxy compound can be obtained by, for example, epoxidizing an alkenyl group-containing phenolic resin with epichlorohydrin, or partially reacting 2-allylphenol against a known epoxy compound. As such epoxy compound, there may be employed compounds represented by the following average formulae (9) and (10).

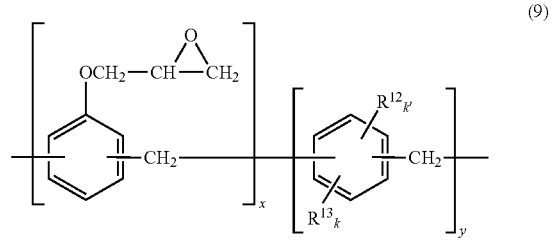

(In formula (9), $R^{12}$ represents an aliphatic monovalent hydrocarbon group having an alkenyl group(s) and 3 to 15 carbon atoms, preferably 3 to 5 carbon atoms; $R^{13}$ represents a glycidyloxy group or a group represented by —OCH$_2$CH(OH)CH$_2$OR'; R' represents a monovalent hydrocarbon group having an alkenyl group(s) and 3 to 10 carbon atoms, preferably 3 to 5 carbon atoms; k represents 1; k' represents 0 or 1; x represents a positive number of 1 to 30; and y represents a positive number of 1 to 3)

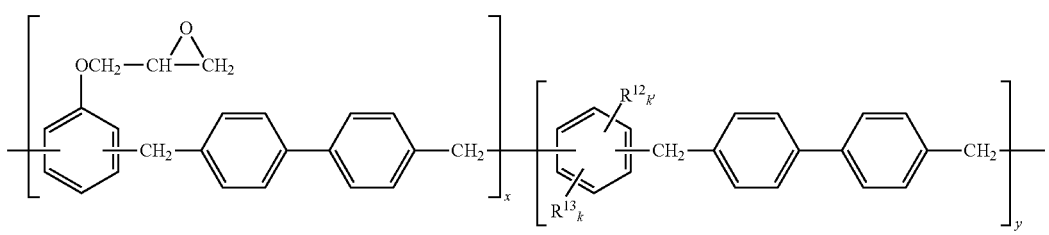

(In formula (10), $R^{12}$, $R^{13}$, k, k', x and y are as same as those described in formula (9))

As the epoxy compound(s) represented by the above average formulae, there may be employed the compounds expressed by the following formulae (11) to (13).

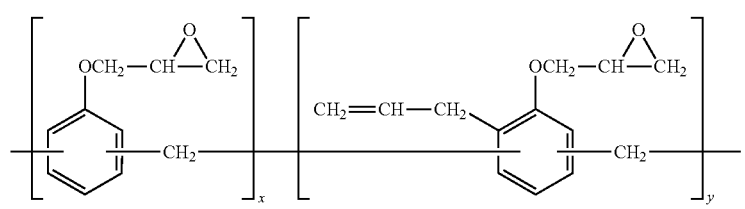

(11)

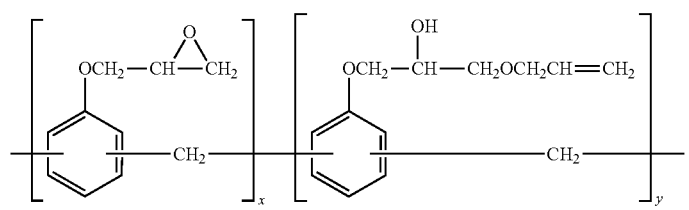

(12)

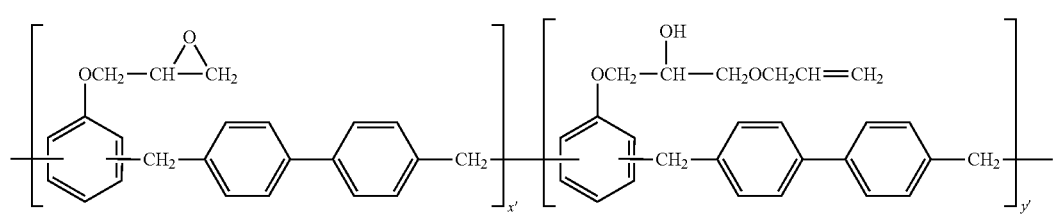

(13)

(In the formulae (11) to (13), x' and y' are positive numbers satisfying 1≤x'≤10, and 1≤y'≤3)

The hydrogen organopolysiloxane represented by the above average formula (8) has at least one SiH group in one molecule. In formula (8), $R^{11}$ represents, for example, an alkyl group such as a methyl group, an ethyl group, a propyl group, an isopropyl group, a butyl group, an isobutyl group, a tert-butyl group, a pentyl group, a neopentyl group, a hexyl group, an octyl group, a nonyl group and a decyl group; an alkenyl group such as a vinyl group, an allyl group, a propenyl group, an isopropenyl group, a butenyl group, a hexenyl group, a cyclohexenyl group and an octenyl group; an aryl group such as a phenyl group, a tolyl group, a xylyl group and a naphthyl group; an aralkyl group such as a benzyl group, a phenylethyl group and a phenylpropyl group; or a group obtained by substituting a part of or all the hydrogen atoms of any of these groups with, for example, cyano groups and/or halogen atoms such as fluorine atoms, bromine atoms and chlorine atoms, Here, examples of said group obtained through substitution include a halogen-substituted alkyl group such as a chloromethyl group, a chloropropyl group, a bromoethyl group and a trifluoropropyl group; and a cyanoethyl group. A methyl group, an ethyl group and a phenyl group are preferred.

The organopolysiloxane represented by the average formula (8) may be linear, cyclic or branched. As such organopolysiloxane, there may be employed those represented by the following formulae (14) to (17).

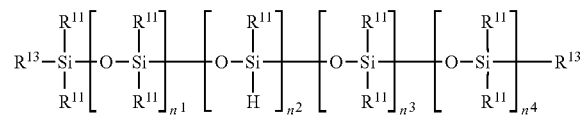

(14)

In formula (14), $R^{11}$ independently represents a substituted or unsubstituted monovalent hydrocarbon group having 1 to 10 carbon atoms, preferably 1 to 6 carbon atoms; $R^{13}$ represents a hydrogen atom or a group selected from the options for $R^{11}$; $R^{12}$ is a group represented by the following formula (15); $n^1$ represents an integer of 5 to 200; $n^2$ represents an integer of 0 to 2; $n^3$ represents an integer of 0 to 10; and $n^4$ represents 1 or 0.

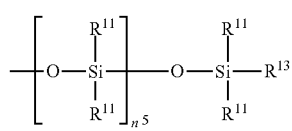

(15)

In formula (15), $R^{11}$ and $R^{13}$ are as same as those described in formula (14); $n^5$ represents an integer of 1 to 10. However, the compound represented by the formula (14) has at least one hydrogen atom bonded to a silicon atom in one molecule.

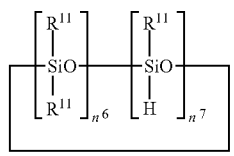

(16)

In formula (16), $R^{11}$ is as same as that described in formula (14); $n^6$ represents an integer of 1 to 10; and $n^7$ represents 1 or 2.

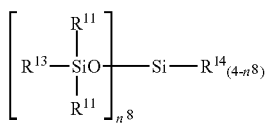

(17)

In formula (17), $R^{11}$ and $R^{13}$ are as same as those described in formula (14); $n^8$ represents an integer of 0 to 3; $R^{14}$ represents a hydrogen atom or a monovalent hydrocarbon group that may have an oxygen atom(s) and has 1 to 10 carbon atoms. The compound represented by formula (17) has at least one hydrogen atom bonded to a silicon atom in one molecule.

Preferable examples of the above hydrogen organopolysiloxane include both terminal-hydrogen methylpolysiloxane and both-terminal hydrogen methylphenyl polysiloxane. For example, the compounds represented by the following formulae (18) and (19) are preferred.

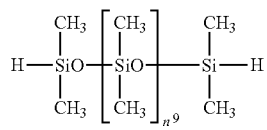

(18)

(In formula (18), $n^9$ represents an integer of 20 to 100)

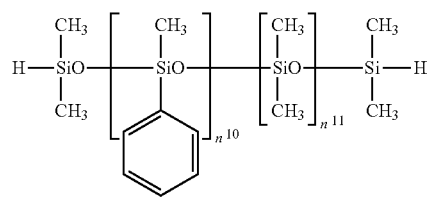

(19)

(In formula (19), $n^{10}$ represents an integer of 1 to 10; $n^{11}$ represents an integer of 10 to 100)

The component (D) is a copolymer obtained by the hydrosilylation reaction of the above alkenyl group-containing epoxy compound and the hydrogen organopolysiloxane. The hydrosilylation reaction may be performed in accordance with a known method. For example, the component (D) can be obtained through a heating reaction in the presence of a platinum-based catalyst such as a chloroplatinic acid. It is particularly preferred that such hydrosilylation reaction be performed by performing heating in an inert solvent such as benzene, toluene and methyl isobutyl ketone, up to a temperature of 60 to 120° C. As for a combination ratio between the epoxy compound and siloxane, it is preferred that the number of the SiH groups of siloxane be not smaller than 1.0, more preferably 1.5 to 5.0 with respect to one alkenyl group in the epoxy compound.

The component (D) in the composition is in an amount of 2 to 30 parts by mass, preferably 4 to 20 parts by mass with respect to 100 parts by mass of a sum total of the components (A), (B), (C) and (D).

A component (E) is at least one kind of compound selected from a tetraphenylborate salt of a tetra-substituted phosphonium compound; and a tetraphenylborate salt represented by the following formula (20). The component (E) is used as a curing accelerator.

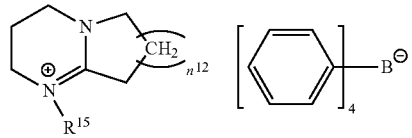

(20)

(In formula (20), $R^{15}$ represents a hydrogen atom, an alkyl group having 1 to 6 carbon atoms or a phenyl group; and $n^{12}$ represents an integer of 1 to 3)

As the component (E) of the present invention, there may be employed a compound represented by the following formula (21) in the case of a tetraphenylborate salt of a derivative of 1,8-diazabicyclo [5.4.0] undecene-7.

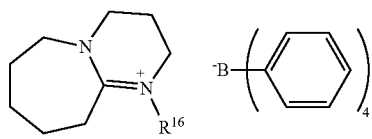

(21)

In formula (21), $R^{16}$ represents a hydrogen atom; or a group selected from a monovalent saturated hydrocarbon group having 1 to 30, preferably 1 to 20 carbon atoms and a monovalent unsaturated hydrocarbon group having 2 to 30, preferably 2 to 20 carbon atoms. Specific examples of such group include a linear saturated hydrocarbon group such as a methyl group, an ethyl group, an n-propyl group, an n-butyl group, an n-pentyl group and an n-hexyl group; a branched saturated hydrocarbon group such as an isopropyl group, an isobutyl group, a t-butyl group, an isopentyl group and a neopentyl group; a cyclic saturated hydrocarbon group such as a cyclopentyl group, a cyclohexyl group and a cycloheptyl group; a linear unsaturated hydrocarbon group such as a vinyl group, an allyl group and a 1-butenyl group; and an aromatic hydrocarbon group such as a phenyl group, a tolyl group, a benzyl group and a naphthyl group. Here, preferable examples are a vinyl group and an allyl group.

Further, as a tetraphenylborate salt of 1,5-diazabicyclo [4.3.0] nonene-5, there may be used a compound represented by the following formula (22).

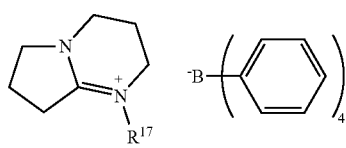

(22)

In formula (22), $R^{17}$ represents a hydrogen atom; or a group selected from a monovalent saturated hydrocarbon group having 1 to 30, preferably 1 to 20 carbon atoms and a monovalent unsaturated hydrocarbon group having 2 to 30, preferably 2 to 20 carbon atoms. Specific examples of such group include those listed as the examples of $R^{16}$. Preferable examples thereof include a methyl group, an ethyl group, a phenyl group and a benzyl group.

Specific examples of these compounds include tetraphenylphosphonium tetraphenylborate, 8-benzyl-1,8-diazabicyclo [5.4.0]-7-undecenium tetraphenylborate, a tetraphenylborate salt of 1,8-diazabicyclo [5.4.0] undecene-7 and a tetraphenylborate salt of 1,5-diazabicyclo [4.3.0] nonene-5.

As for the composition of the present invention, in addition to the formation of triazine ring(s) due to the cyclization reaction of the cyanate ester compound, there also occur a reaction (formation of oxazole ring(s)) between the epoxy compound and the cyanate ester compound; a reaction between the phenolic compound and the cyanate ester compound; and a reaction between the epoxy compound and the phenolic compound. That is, the reaction initiation temperatures of the above reactions will differ from one another if the curing accelerator used is not appropriate, which will then incur problems such as molding failures, insufficient fluidities and inadequate properties of the cured product. The composition of the present invention was found to be able to provide a cured product exceptionally superior in high-temperature and high-humidity resistance through the above reactions with the aid of the particular curing accelerator (E) added at a particular ratio. The component (E) is added in an amount of 0.1 to 3 parts by mass, preferably 0.2 to 1.0 parts by mass with respect to 100 parts by mass of a sum total of the components (A), (B), (C) and (D).

If necessary, there may be further added to the encapsulation resin composition of the present invention various additive agents such as an inorganic filler, a mold release agent, a flame retardant, an ion trapping agent, an antioxidant and an adhesion imparting agent.

Examples of such inorganic filler include silicas such as molten silica, crystalline silica and cristobalite; alumina; silicon nitride; aluminum nitride; boron nitride; titanium oxide; a glass fiber; magnesium oxide; and zinc oxide. There are no particular restrictions on the average particle diameters and shapes of these inorganic fillers. In fact, these inorganic fillers are selected depending on the intended use. In general, the average particle diameter of such inorganic filler(s) is 1 to 50 μm, particularly 4 to 20 μm. Such average particle diameter is obtained through a laser-diffraction particle size distribution measurement device such as those produced by CILAS.

There are no particular restrictions on the mold release agent. In fact, a known mold release agent(s) may be used. Examples of such mold release agent include a carnauba wax; a rice wax; a candelilla wax; polyethylene; polyethylene oxide; polypropylene; a montanic acid; a montanic acid wax as an ester compound of a montanic acid and a saturated alcohol, 2-(2-hydroxyethylamino)-ethanol, ethylene glycol, glycerin or the like; a stearic acid; stearic acid ester; stearic acid amide; amide ethylene-bis-stearate; and a copolymer of ethylene and vinyl acetate. Any one of these mold release agents may be used singularly, or two or more of them may be used in combination.

There are no particular restrictions on the flame retardant. In fact, all the known flame retardants may be used. Examples of such flame retardant include a phosphazene compound, a silicone compound, a zinc molybdate-supported talc, a zinc molybdate-supported zinc oxide, an aluminum hydroxide, a magnesium hydroxide, a molybdenum oxide and antimony trioxide.

There are no particular restrictions on the ion trapping agent. In fact, a known ion trapping agent(s) may be used. Examples of such ion trapping agent include hydrotalcites, a bismuth hydroxide compound and a rare-earth oxide.

There are no particular restrictions on a manufacturing method of the composition of the present invention. For example, the composition can be obtained by simultaneously or separately stirring, dissolving, mixing and/or dispersing the components (A) to (E) while performing a heat treatment if necessary; or even by adding to such mixture an other additive agent(s), followed by further stirring, mixing and/or dispersing the ingredients. Although there are no particular restrictions on the devices used to perform mixing or the like, there may be used, for example, a kneader equipped with a stirring and/or a heating device, a twin-roll mill, a triple-roll mill, a ball mill, a continuous extruder, a planetary mixer and a mass-colloider. These devices can be appropriately used in combination.

The composition of the present invention is suitable for use in a semiconductor package of, for example, a transistor type, a module type, a DIP type, an SO type, a flat pack type or a ball grid array type. The composition of the present invention may be molded in accordance with a conventional molding method. For example, there may be employed transfer molding, compression molding, injection molding and cast molding. Here, transfer molding is particularly preferable. As for a molding temperature(s) of the composition of the present invention, it is desired that molding be performed at 160 to 190° C. for 45 to 180 sec, and that post curing be then performed at 170 to 250° C. for 2 to 16 hours.

The composition of the present invention is able to provide a cured product exhibiting a small degree of heat decomposition (reduction in weight) when left for a long period of time under a high-temperature environment of not lower than 200° C., particularly 200 to 250° C.; a superior adhesiveness to Cu LF and Ag platings; and a high insulation property. Thus, a semiconductor device encapsulated by the cured product of the composition of the present invention has a long-term reliability under a high-temperature environment. Further, since the composition of the present invention has a favorable continuous moldability, it can be processed by the same type of device(s) as those designed for an epoxy resin composition as a conventional transfer molding material generally used. Also, the same type of molding conditions as such epoxy resin composition may be applied to the composition of the present invention. Due to these properties, the composition of the present invention is also superior in productivity.

WORKING EXAMPLE

The present invention is described in greater detail hereunder with reference to working and comparative examples. However, the present invention is not limited to the following working examples. The expression "part(s)" in each example refers to "parts by mass."

Working Examples 1 to 5, Comparative Examples 1 to 6

All of the following components were combined together in accordance with the composition amounts shown in Tables 1 and 2, followed by mixing the same at 120° C. for 3 min and then measuring an onset temperature, a peak temperature and a heating value that are associated with an exothermal reaction through a differential thermal analyzer (DSC 821 by Mettler-Toledo International Inc.; under nitrogen atmosphere, rate of temperature increase 5° C./min). Further, the mixture was thermally cured at 150° C. for an hour, and then at 180° C. for 4 hours, followed by storing the same under an atmosphere of 250° C. for 96 hours and then measuring a weight reduction rate thereof. The results are shown in Tables 1 and 2.

(A) Cyanate Ester Compound
(a) Cyanate ester compound represented by the following formula (23) (Primaset PT-60 by LONZA Japan, cyanato group equivalent 119)

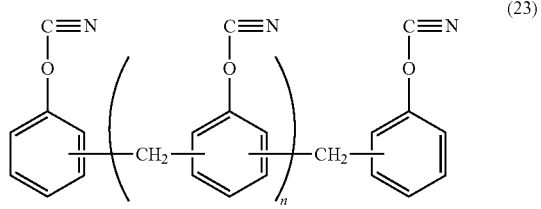

(mixture where n=0 to 10)
(B) Phenolic Compound
(b) Phenolic compound represented by the following formula (24) (MEH-7851SS by MEIWA PLASTIC INDUSTRIES, LTD, phenolic hydroxyl group equivalent 203)

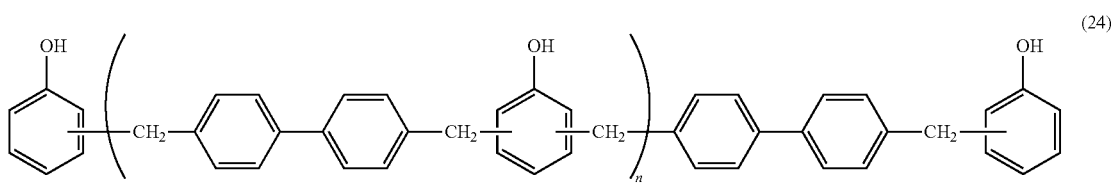

(mixture where n=0 to 10)
(C) Epoxy Resin
(c) Epoxy resin compound represented by the following formula (25) (NC-3000 by Nippon Kayaku Co., Ltd, epoxy equivalent 272)

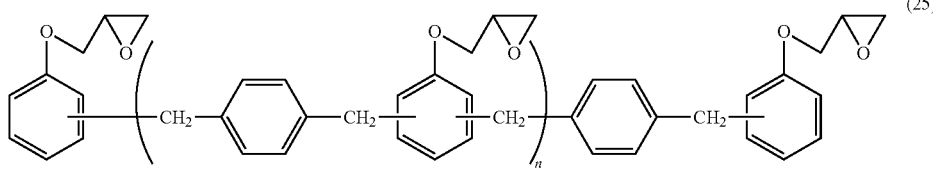

(mixture where n=0 to 10)
(D) Synthesis Example of Copolymer Compound (d) Obtained by Reaction of Alkenyl Group-Containing Epoxy Compound and Organopolysiloxane A phenol novolac resin of 200 g that has been modified by allyl glycidyl ether (phenol equivalent 125, allyl equivalent 1,100), chloromethyl oxirane of 800 g and cetyltrimethyl ammonium bromide of 0.6 g were respectively put into a four-necked flask having an inner volume of 1 L and including a reflux condenser, a thermometer, a stirrer and a dropping funnel, followed by performing heating as to stir and mix the ingredients at 110° C. for 3 hours. After the mixture was cooled to 70° C., and a pressure was reduced to 160 mmHg, a 50% sodium hydroxide aqueous solution of an amount of 128 g was delivered thereinto by drops for 3 hours while performing azeotropic dehydration. A content thus obtained was then depressurized to distil away the solvent, and was later dissolved in a mixed solvent of methyl isobutyl ketone of 300 g and acetone of 300 g, followed by washing the same with water and then distilling away the solvent under a reduced pressure so as to obtain an allyl group-containing epoxy resin (ally equivalent 1,590, epoxy equivalent 190). Methyl isobutyl ketone of an amount of 170 g, toluene of an amount of 330 g and a 2-ethylhexanol modified chloroplatinic acid solution of a platinum concentration of 2% and an amount of 0.07 g were then delivered into such epoxy resin to perform azeotropic dehydration for an hour, followed by delivering thereinto by drops an organopolysiloxane represented by the following formula (26) and of an amount of 133 g at a reflux temperature for 30 min. Further, stirring was performed at the same temperature for 4 hours to effect the reaction(s), and a content thus obtained was later washed with water. By distilling away the solvent under a reduced pressure, there was then obtained a copolymer (d) in the form of a whitish yellow opaque solid. The copolymer exhibited an epoxy equivalent of 280, an ICI melt viscosity of 800 cP at 150° C., a silicon content of 31% and an epoxy equivalent of 323.

(E)

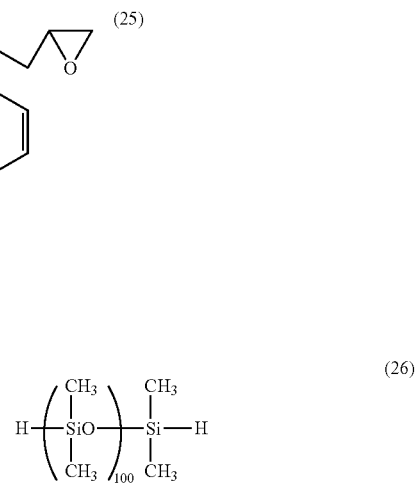

(e-1) 8-benzyl-1,8-diazabicyclo [5.4.0]-7-undecenium tetraphenylborate (U-CAT SA5002 by San-Apro Ltd.)
(e-2) Tetraphenylphosphonium tetraphenylborate (by HOKKO CHEMICAL INDUSTRY CO., LTD.)

(Other Components)
(f-1) Curing accelerator; Triphenylphosphine (by HOKKO CHEMICAL INDUSTRY CO., LTD.)
(f-2) Curing accelerator; Triphenylphosphine and p-benzoquinone adduct
(f-3) Curing accelerator; 2-phenylimidazole (by Shikoku Chemicals Corporation)
(g-1) Curing agent; Phenol resin salt of 1.8-diazabicyclo [5.4.0] undecene-7 (U-CAT SA851 by San-Apro Ltd.)

was subjected to an evaluation(s) in accordance with the following methods. The evaluation results are shown in Tables 3 and 4.

Molten spherical silica (by TATSUMORI LTD., average particle diameter 10 μm)
Carnauba wax (TOWAX-131 by TOA KASEI CO., LTD.)
Silane coupling agent
3-mercaptopropyltrimethoxysilane (KBM-803 by Shin-Etsu Chemical Co., Ltd.)

TABLE 1

|  |  |  | Working example | | | | |
|---|---|---|---|---|---|---|---|
|  |  |  | 1 | 2 | 3 | 4 | 5 |
| Composition amount (part by mass) | (A) | a | 76 | 76 | 76 | 65 | 50 |
|  | (B) | b | 11 | 11 | 11 | 15 | 21 |
|  | (C) | c | 6.24 | 6.24 | 6.24 | 13.2 | 22.2 |
|  | (D) | d | 6.76 | 6.76 | 6.76 | 6.8 | 6.8 |
|  | (E) | e-1 | 0.2 | 0.5 |  | 0.2 | 0.2 |
|  |  | e-2 |  |  | 0.5 |  |  |
| Curing accelerator | f-1 |  |  |  |  |  |  |
|  | f-2 |  |  |  |  |  |  |
|  | f-3 |  |  |  |  |  |  |
| Curing agent | g-1 |  |  |  |  |  |  |
| Phenolic hydroxyl group/Cyanate group molar ratio |  |  | 0.08 | 0.08 | 0.08 | 0.135 | 0.245 |
| Epoxy group/Cyanate group molar ratio |  |  | 0.06 | 0.06 | 0.06 | 0.122 | 0.23 |
| DSC Onset temperature (° C.) |  |  | 160 | 152 | 165 | 157 | 145 |
| DSC Peak temperature (° C.) |  |  | 180 | 173 | 183 | 174 | 164 |
| DSC Heating value (J/g) |  |  | 440 | 435 | 435 | 440 | 430 |
| Reduction rate of storage weight [250° C. × 96 hours] (%) |  |  | −1.5 | −1.4 | −1.6 | −1.6 | −1.7 |

TABLE 2

|  |  |  | Comparative example | | | | | |
|---|---|---|---|---|---|---|---|---|
|  |  |  | 1 | 2 | 3 | 4 | 5 | 6 |
| Composition amount (part by mass) | (A) | a | 76 | 76 | 76 | 76 | 76 | 76 |
|  | (B) | b | 11 | 11 | 11 | 11 | 11 | 11 |
|  | (C) | c | 6.24 | 6.24 | 6.24 | 6.24 | 6.24 | 6.24 |
|  | (D) | d | 6.76 | 6.76 | 6.76 | 6.76 | 6.76 | 6.76 |
|  | (E) | e-1 |  |  |  |  |  |  |
|  |  | e-2 |  |  |  |  |  |  |
| Curing accelerator | f-1 |  |  | 0.5 | 1 |  |  |  |
|  | f-2 |  |  |  |  | 0.5 |  |  |
|  | f-3 |  |  |  |  |  | 0.5 |  |
| Curing agent | g-1 |  |  |  |  |  |  | 0.5 |
| Phenolic hydroxyl group/Cyanate group molar ratio |  |  | 0.08 | 0.08 | 0.08 | 0.08 | 0.08 | 0.08 |
| Epoxy group/Cyanate group molar ratio |  |  | 0.06 | 0.06 | 0.06 | 0.06 | 0.06 | 0.06 |
| DSC Onset temperature (° C.) |  |  | 163 | 162 | 162 | 162 | 110 | 160 |
| DSC Peak temperature (° C.) |  |  | 195 | 192 | 192 | 192 | 155 | 190 |
| DSC Heating value (J/g) |  |  | 460 | 440 | 440 | 440 | 370 | 425 |
| Reduction rate of storage weight [250° C. × 96 hours] (%) |  |  | −3.2 | −2.6 | −2.5 | −2.5 | −3.2 | −2.2 |

Working Examples 6 to 11, Comparative Examples 7 to 10

In addition to the abovementioned components, the following components were also added in accordance with the composition amounts shown in Tables 3 and 4. A heated twin-roll mill was then used to homogenously melt and mix the ingredients, followed by cooling and then crushing the same so to obtain a composition. Each composition obtained 3-glycidoxypropyltrimethoxysilane (KBM-403 by Shin-Etsu Chemical Co., Ltd.)
Ion trapping agent: hydrotalcite compound (DHT-4A-2 by Kyowa Chemical Industry Co., Ltd.)

Each composition was subjected to the following evaluation tests. The results thereof are shown in Tables 3 and 4.
(Moldability)

An 80 pin QFP (14×20×2.7 mm) was molded under the conditions of 175° C.×120 sec and 6.9 MPa. The number of shots delivered before mold adhesion, cull and/or runner breakages had occurred was observed.

(Reliability Evaluation when Stored at High Temperature)

Transfer molding was performed under the conditions of 175° C.×120 sec and molding pressure 6.9 MPa, using a 100 pin QFP lead frame made of a Cu alloy (Olin C7025) and whose die pad section (8 mm×8 mm) and wire bonding section are plated with Ag. Next, post curing was performed at 180° C. for 4 hours. A lead frame cutter was then used to cut a tie bar(s) so as to obtain a QFP package of a size of 20 mm×14 mm×2.7 mm.

Twelve of such package were later stored in an oven of a temperature of 250° C. for 500 hours, followed by visually confirming the presence or absence of cracks formed on the packages that had been stored. Further, an ultrasonic test equipment was used to observe the presence or absence of inner cracks and any type of peeling from the lead frame. The numbers of the packages where cracks and peeling were observed are shown in Tables 3 and 4.

(Temperature Cycling Test)

Transfer molding was performed under the conditions of 175° C.×120 sec and molding pressure 6.9 MPa, using a 100 pin QFP lead frame made of a Cu alloy (Olin C7025) and whose die pad section (8 mm×8 mm) and wire bonding section are plated with Ag. Next, post curing was performed at 180° C. for 4 hours. A lead frame cutter was then used to cut a tie bar(s) so as to obtain a QFP package of a size of 20 mm×14 mm×2.7 mm.

Twelve of such package were subjected to a temperature cycling test of 1,000 cycles using a temperature cycle testing device (−65° C.×30 min, 200° C.×30 min), followed by visually confirming the presence or absence of cracks formed on the packages. Further, an ultrasonic test equipment was used to observe the presence or absence of inner cracks and any type of peeling from the lead frame. The numbers of the packages where cracks and peeling were observed are shown in Tables 3 and 4.

TABLE 3

| | | | Working example | | | | | |
|---|---|---|---|---|---|---|---|---|
| | | | 6 | 7 | 8 | 9 | 10 | 11 |
| Composition amount (part by mass) | (A) | a | 76 | 76 | 76 | 65 | 65 | 50 |
| | (B) | b | 11 | 11 | 11 | 15 | 14.15 | 21 |
| | (C) | c | 6.24 | 6.24 | 6.24 | 13.2 | 10.8 | 22.2 |
| | (D) | d | 6.76 | 6.76 | 6.76 | 6.8 | 10 | 6.8 |
| | (E) | e-1 | 0.2 | 0.5 | | 0.2 | 0.2 | 0.2 |
| | | e-2 | | | 0.5 | | | |
| | Curing accelerator | f-1 | | | | | | |
| | | f-2 | | | | | | |
| | | f-3 | | | | | | |
| | Curing agent | g-1 | | | | | | |
| | Molten spherical silica | | 420 | 420 | 420 | 420 | 420 | 420 |
| | Carnauba wax | | 2 | 2 | 2 | 2 | 2 | 2 |
| | Hydrotalcite compound | | 2 | 2 | 2 | 2 | 2 | 2 |
| | 3-glycidoxypropyltrimethoxysilane | | 2 | 2 | 2 | 2 | 2 | 2 |
| | 3-mercaptopropyltrimethoxysilane | | 0.3 | 0.3 | 0.3 | 0.3 | 0.3 | 0.3 |
| Phenolic hydroxyl group/Cyanate group molar ratio | | | 0.08 | 0.08 | 0.08 | 0.135 | 0.13 | 0.245 |
| Epoxy group/Cyanate group molar ratio | | | 0.06 | 0.06 | 0.06 | 0.122 | 0.13 | 0.23 |
| Moldability | | | >200 | >200 | >200 | >200 | >200 | >200 |
| Reliability evaluation when stored under high temperature | Number of packages exhibiting cracks (number/12) | | 0 | 0 | 0 | 0 | 0 | 0 |
| | Number of packages exhibiting peeling from LF (number/12) | | 0 | 0 | 0 | 0 | 0 | 0 |
| Temperature cycling test | Number of packages exhibiting cracks (number/12) | | 0 | 0 | 0 | 0 | 0 | 0 |
| | Number of packages exhibiting peeling from LF (number/12) | | 0 | 0 | 0 | 0 | 0 | 0 |

TABLE 4

| | | | Comparative example | | | |
|---|---|---|---|---|---|---|
| | | | 7 | 8 | 9 | 10 |
| Composition amount (part by mass) | (A) | a | 76 | 76 | 76 | 50 |
| | (B) | b | 11 | 11 | 24 | 21.4 |
| | (C) | c | 6.24 | 6.24 | | 28.6 |
| | (D) | d | 6.76 | 6.76 | | |
| | (E) | e-1 | | | | 0.2 |
| | | e-2 | | | | |
| | Curing accelerator | f-1 | | | 1 | 1 |
| | | f-2 | | | | |
| | | f-3 | | | | |
| | Curing agent | g-1 | | | | |
| | Molten spherical silica | | 420 | 420 | 420 | 420 |
| | Carnauba wax | | 2 | 2 | 2 | 2 |
| | Hydrotalcite compound | | 2 | 2 | 2 | 2 |
| | 3-glycidoxypropyltrimethoxysilane | | 2 | 2 | 2 | 2 |
| | 3-mercaptopropyltrimethoxysilane | | 0.3 | 0.3 | 0.3 | 0.3 |
| Phenolic hydroxyl group/Cyanate group molar ratio | | | 0.08 | 0.08 | 0.109 | 0.26 |

TABLE 4-continued

|  |  | Comparative example | | | |
|---|---|---|---|---|---|
|  |  | 7 | 8 | 9 | 10 |
| Epoxy group/Cyanate group molar ratio | | 0.06 | 0.06 | 0.046 | 0.26 |
| Moldability | | 58 | 60 | >200 | 14 |
| Reliability evaluation when stored under high temperature | Number of packages exhibiting cracks (number/12) | 0 | 0 | 0 | 0 |
|  | Number of packages exhibiting peeling from LF (number/12) | 0 | 0 | 0 | 4 |
| Temperature cycling test | Number of packages exhibiting cracks (number/12) | 0 | 0 | 12 | 12 |
|  | Number of packages exhibiting peeling from LF (number/12) | 0 | 0 | 12 | 12 |

INDUSTRIAL APPLICABILITY

The resin composition of the present invention has a favorable moldability; and the cured product thereof is superior in adhesion to a Cu LF and Ag plating even after being left under a high temperature of not lower than 200° C. e.g. 250° C. for a long period of time. Further, the cured product also exhibits a superior reliability during a temperature cycling test of −65° C. to 200° C. Thus, the composition of the present invention and the cured product thereof are suitable for use in a power semiconductor device mounted on a vehicle.

What is claimed:

1. A semiconductor encapsulation resin composition comprising:
(A) a cyanate ester compound having not less than two cyanato groups in one molecule;
(B) a phenolic compound represented by the following general formula (3):

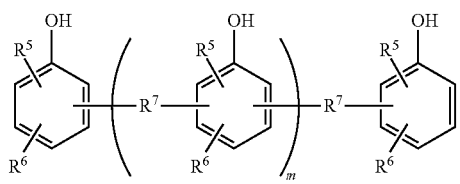
(3)

wherein in formula (3), m represents an integer of 0 to 10; each $R^5$ independently represents a hydrogen atom or an alkyl group having 1 to 4 carbon atoms; each $R^6$ independently represents a hydrogen atom or an alkyl group having 1 to 4 carbon atoms; and each $R^7$ independently represents a group selected from the divalent groups expressed by the following formulae:

—CH(CH$_3$)—, —O—, —S—, —SO$_2$—,

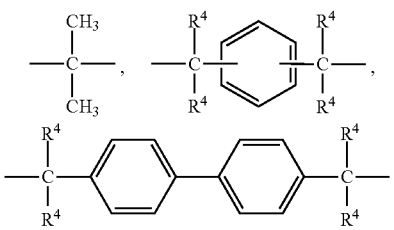

-continued

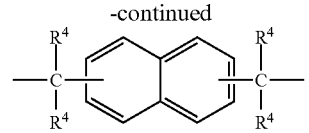

wherein in the above formulae, each $R^4$ independently represents a hydrogen atom or a methyl group;
(C) at least one of the epoxy resins represented by the following formulae (5) and (6):

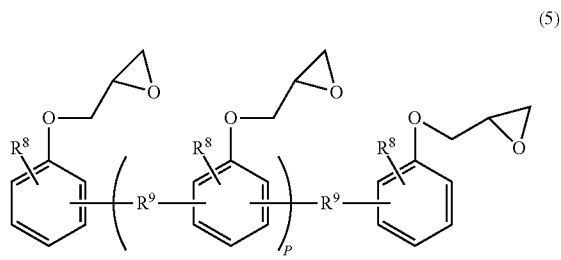
(5)

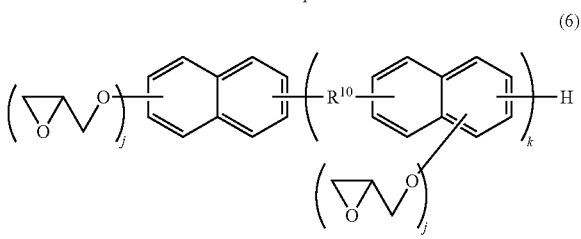
(6)

wherein in formula (5), $R^8$ independently represents a hydrogen atom or an alkyl group having 1 to 4 carbon atoms; $R^9$ independently represents a group selected from the divalent groups expressed by the following formulae; and p represents an integer of 0 to 10,
and wherein in formula (6), $R^{10}$ independently represents a group selected from the divalent groups expressed by the following formulae; j independently represents an integer of 1 to 6; and k represents an integer of 0 to 10

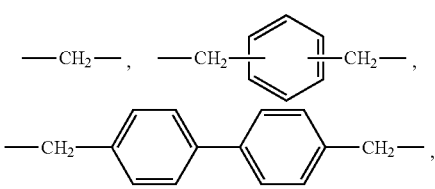

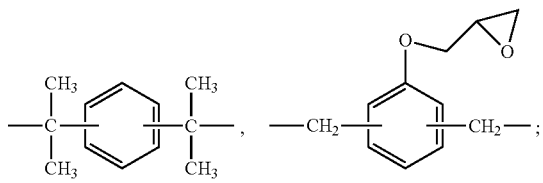

(D) a copolymer obtained by a hydrosilylation reaction of an alkenyl group-containing epoxy compound and an organopolysiloxane represented by the following average formula (8)

$$H_a R_b^{11} SiO_{\frac{4-(a+b)}{2}} \quad (8)$$

wherein in formula (8), $R^{11}$ independently represents a substituted or unsubstituted monovalent hydrocarbon group having 1 to 10 carbon atoms; a is a positive number satisfying $0.01 \leq a \leq 1$, and b is a positive number satisfying $1 \leq b \leq 3$, provided that $1.01 \leq a+b < 4$; and (E) at least one kind of compound selected from a tetraphenylborate salt of a tetra-substituted phosphonium compound and a tetraphenylborate salt represented by the following formula (9)

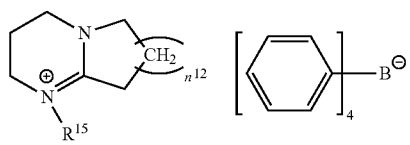

wherein in formula (9), $R^{15}$ represents a hydrogen atom, an alkyl group having 1 to 6 carbon atoms or a phenyl group; and $n^{12}$ represents an integer of 1 to 3, and wherein a molar ratio of phenolic hydroxyl groups in said phenolic compound (B) to cyanato groups in said cyanate ester compound (A) is 0.08 to 0.25, and a molar ratio of epoxy groups in said epoxy resin (C) and said component (D) to cyanato groups in said cyanate ester compound (A) is 0.04 to 0.25.

2. The semiconductor encapsulation resin composition according to claim 1, wherein said component (A) is a compound represented by the following general formula (1)

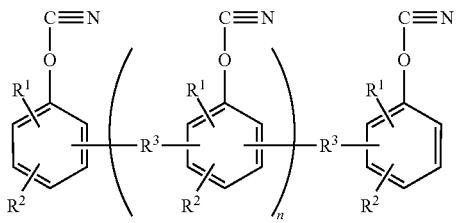

wherein in formula (1), n represents an integer of 0 to 10; each $R^1$ independently represents a hydrogen atom or an alkyl group having 1 to 4 carbon atoms; each $R^2$ independently represents a hydrogen atom or an alkyl group having 1 to 4 carbon atoms; and each $R^3$ independently represents a group selected from the divalent groups expressed by the following formulae

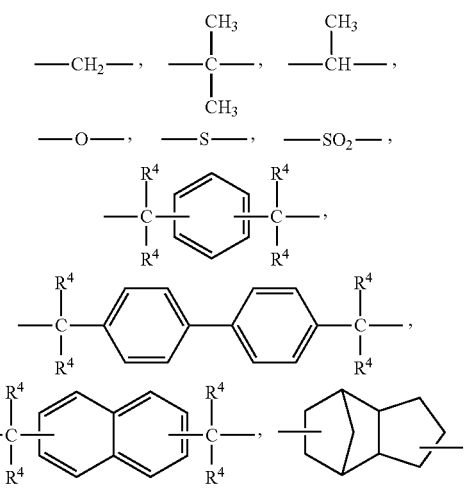

wherein in the above formulae, each $R^4$ independently represents a hydrogen atom or a methyl group.

3. A semiconductor device comprising a cured product of the semiconductor encapsulation resin composition as set forth in claim 1.

4. A semiconductor device comprising a cured product of the semiconductor encapsulation resin composition as set forth in claim 2.

5. The semiconductor device according to claim 3, further comprising a semiconductor element having SiC or GaN.

6. The semiconductor device according to claim 4, further comprising a semiconductor element having SiC or GaN.

* * * * *